US010733345B1

(12) United States Patent
Ovadia et al.

(10) Patent No.: US 10,733,345 B1
(45) Date of Patent: Aug. 4, 2020

(54) METHOD AND SYSTEM FOR GENERATING A VALIDATION TEST

(71) Applicant: Cadence Design Systems, Inc., San Jose, CA (US)

(72) Inventors: Meir Ovadia, Rosh Ha-Ayin (IL); Matan Vax, Ramot Menashe (IL)

(73) Assignee: Cadence Design Systems, Inc., San Jose, CA (US)

( * ) Notice: Subject to any disclaimer, the term of this patent is extended or adjusted under 35 U.S.C. 154(b) by 77 days.

(21) Appl. No.: 16/109,765

(22) Filed: Aug. 23, 2018

(51) Int. Cl.
| | |
|---|---|
| *G06F 17/50* | (2006.01) |
| *G06F 11/27* | (2006.01) |
| *G06F 11/267* | (2006.01) |
| *G06F 11/22* | (2006.01) |
| *G01R 31/28* | (2006.01) |
| *G06F 30/3323* | (2020.01) |
| *G06F 30/3308* | (2020.01) |
| *G06F 30/333* | (2020.01) |
| *G06F 30/33* | (2020.01) |

(52) U.S. Cl.
CPC .......... *G06F 30/3323* (2020.01); *G01R 31/28* (2013.01); *G06F 11/2268* (2013.01); *G06F 11/267* (2013.01); *G06F 11/27* (2013.01); *G06F 30/33* (2020.01); *G06F 30/333* (2020.01); *G06F 30/3308* (2020.01)

(58) Field of Classification Search
CPC .... G06F 30/3323; G06F 30/333; G06F 30/33; G06F 30/3308; G06F 11/27; G06F 11/267; G06F 11/2268; G01R 31/28
USPC ....... 716/106, 111, 136; 703/16, 20; 714/25, 714/30, 33, 732, 733, 734, 741
See application file for complete search history.

(56) References Cited

U.S. PATENT DOCUMENTS

| | | | | | |
|---|---|---|---|---|---|
| 5,004,978 | A | * | 4/1991 | Morris, Jr. ..... | G01R 31/318307 324/537 |
| 5,452,239 | A | * | 9/1995 | Dai ..................... | G06F 17/5027 703/19 |
| 7,458,043 | B1 | * | 11/2008 | Cischke ......... | G01R 31/318357 703/22 |
| 8,560,893 | B1 | * | 10/2013 | Hollander ............... | G06F 11/00 714/47.1 |
| 9,027,016 | B1 | * | 5/2015 | Alford ...................... | G06F 8/61 717/177 |
| 9,582,406 | B1 | * | 2/2017 | Teplitsky ............... | G06F 11/263 |

(Continued)

FOREIGN PATENT DOCUMENTS

| | | | | |
|---|---|---|---|---|
| WO | WO-2007038340 A2 | * | 4/2007 | ....... G11C 29/56004 |

*Primary Examiner* — Phallaka Kik
(74) *Attorney, Agent, or Firm* — Pearl Cohen Zedek Latzer Baratz LLP

(57) ABSTRACT

A method for automatically finding a verification test of a plurality of verification tests that were executed in a verification process of a design under test (DUT) that satisfies a criterion, may include using a processor, obtaining from a user a criterion that relates to one or more test actions; using a processor, obtaining a log with logged execution data that includes start and end times for each action of each of the tests of the plurality of verification tests during an execution run of that test; and for each test of the plurality of verification tests, using a processor, determining from the logged data whether that test satisfies the obtained criterion, and if a test of the plurality of verification tests was determined to satisfy the obtained criterion, using a processor, executing that test on the DUT.

17 Claims, 5 Drawing Sheets

(56) References Cited

U.S. PATENT DOCUMENTS

| | | | |
|---|---|---|---|
| 9,792,402 B1* | 10/2017 | Ovadia | G06F 17/5081 |
| 10,026,500 B2* | 7/2018 | Doron | G06F 11/263 |
| 2002/0133774 A1* | 9/2002 | Inoue | G01R 31/31935 |
| | | | 714/736 |
| 2003/0061144 A1* | 3/2003 | Brickell | G06F 21/33 |
| | | | 705/37 |
| 2005/0149313 A1* | 7/2005 | Roesner | G01R 31/318364 |
| | | | 703/22 |
| 2005/0241000 A1* | 10/2005 | Kawauchi | G06F 21/577 |
| | | | 726/25 |
| 2006/0143232 A1* | 6/2006 | Ernst | G06F 16/219 |
| 2008/0266594 A1* | 10/2008 | Lankreijer | G06F 3/1207 |
| | | | 358/1.15 |
| 2009/0292963 A1* | 11/2009 | Gass | G01R 31/318307 |
| | | | 714/733 |
| 2010/0070239 A1* | 3/2010 | Wang | G06F 11/3419 |
| | | | 702/182 |
| 2010/0100871 A1* | 4/2010 | Celeskey | G06F 11/008 |
| | | | 717/124 |
| 2012/0078951 A1* | 3/2012 | Hsu | G06F 16/24568 |
| | | | 707/769 |
| 2012/0117537 A1* | 5/2012 | Sierk | C07H 21/00 |
| | | | 717/113 |
| 2012/0221589 A1* | 8/2012 | Shahar | G06F 16/248 |
| | | | 707/758 |
| 2014/0250328 A1* | 9/2014 | Schnizler | G06F 11/2733 |
| | | | 714/31 |
| 2015/0067622 A1* | 3/2015 | Goswami | G06F 17/5009 |
| | | | 716/106 |
| 2015/0227445 A1* | 8/2015 | Arscott | G06F 11/3062 |
| | | | 713/340 |
| 2016/0269168 A1* | 9/2016 | Carstens | G06Q 10/083 |
| 2017/0147622 A1* | 5/2017 | Sterzbach | G06K 9/00718 |
| 2018/0089465 A1* | 3/2018 | Winstrom | H04L 51/12 |
| 2019/0012256 A1* | 1/2019 | Poppe | G06F 11/3664 |

* cited by examiner

```
┌─────────────────────────────────────┐
│ Using a processor, obtain from a    │
│ user a criterion that relates to    │
│ one or more test actions            │
│                 202                 │
└─────────────────────────────────────┘
                  │
                  ▼
┌─────────────────────────────────────┐
│ Using a processor, obtain a log     │
│ with logged execution data that     │
│ includes start and end times for    │
│ each action of each of the tests of │
│ the plurality of verification tests │
│ during an execution run of that test│
│                 204                 │
└─────────────────────────────────────┘
                                         200
                  │
                  ▼
┌─────────────────────────────────────┐
│ For each test of the plurality of   │
│ verification tests, using a         │
│ processor, determine from the       │
│ logged data whether that test       │
│ satisfies the obtained condition    │
│                 206                 │
└─────────────────────────────────────┘
                  │
                  ▼
┌─────────────────────────────────────┐
│ If a test of the plurality of       │
│ verification tests was determined   │
│ to satisfy the obtained criterion   │
│ executing that test on the DUT      │
│                 208                 │
└─────────────────────────────────────┘
```

Fig. 2

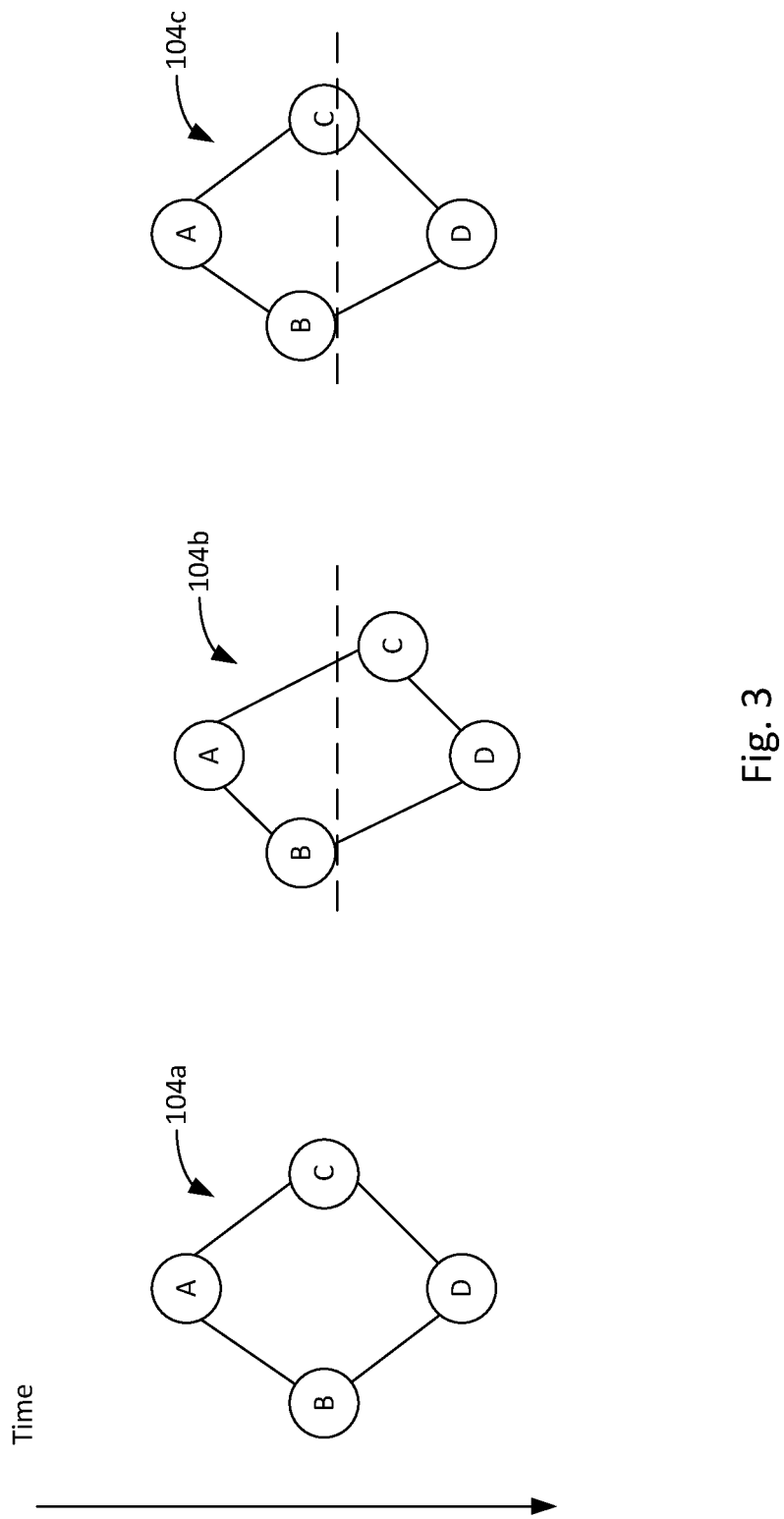

METHOD AND SYSTEM FOR GENERATING A VALIDATION TEST

FIELD OF THE INVENTION

The present invention relates to verification and more particularly to methods and systems for generating a validation test for testing an electronic design.

BACKGROUND

Design verification is a common process for testing a newly designed integrated circuit, board, or system-level architecture, to, for example, confirm that it complies with the requirements defined by the specification of the architecture for that device. Design verification for a device under test (DUT) may be performed on the actual device, but can usually be a simulation model of the device is tested.

Verification of electronic designs typically has three forms. At an early stage, before the electronic design is implemented in hardware, simulation can be conducted on a model of the design. Another form can be emulation, in which one electronic hardware is used to mimic the behavior of another (tested) electronic hardware. At more advanced stages of design development a system on chip can be validated, in a process which is typically referred to as post-silicon validation. Post-silicon validation can be a last stage in the electronic design development, for example, before it is manufactured.

Post-silicon validation tests can be carried out on actual devices running at speed on realistic system boards, the results of which can be assessed by a logic analyzer and other validation tools.

In a typical verification process an electronic design undergoes testing which includes designing various validated testing scenarios which are generated as code and executed. The vast numbers of accumulated tests may make it virtually impossible to search and find tests that meet certain desired characteristics or criteria.

SUMMARY

There is thus provided, according to some embodiments of the present invention, a method for automatically finding a verification test of a plurality of verification tests that were executed in a verification process of a design under test (DUT) that satisfies a criterion. The method may include using a processor, obtaining from a user a criterion that relates to one or more test actions; using a processor, obtaining a log with logged execution data that includes start and end times for each action of each of the tests of the plurality of verification tests during an execution run of that test; and for each test of the plurality of verification tests, using a processor, determining from the logged data whether that test satisfies the obtained criterion, and if a test of the plurality of verification tests was determined to satisfy the obtained criterion, using a processor, executing that test on the DUT.

According to some embodiments of the present invention, the determining from the logged data whether that test satisfies the criterion includes applying a finite state machine on the logged data to determine whether that test satisfies the obtained conditions.

According to some embodiments of the present invention, the determining from the logged data whether that test satisfies the condition includes applying a plurality of finite state machines on the logged data to determine whether that test satisfies the obtained criterion.

According to some embodiments of the present invention, the criterion is selected from the group consisting of: the order in which test actions are executed or planned to be executed, whether the actions are repeated, a relation in time between test actions, test actions performed, or planned to be performed concurrently, test actions performed one before the other, the time interval between test actions, the time between the end of an earlier action and the beginning of a later action.

According to some embodiments of the present invention, the log contains items selected from the group consisting of chronologically ordered list of start and end times of test actions that were performed in the execution a test, unique identification of each of the actions messages, identification of a thread in which an action of the test actions was performed, and identification of a core which executed an action of the actions.

According to some embodiments of the present invention, if it was determined that the test satisfies the obtained criterion, the method includes identifying one or more instances of said one or more test actions that conform to the criterion.

According to some embodiments of the present invention, the method further includes outputting the test which was determined to satisfy the obtained criterion and the identified instances of said one or more test actions.

According to some embodiments of the present invention, there is provided a method for automatically finding a solution of a plurality of solutions that includes executable actions of a plurality of solutions for use in verification that satisfies a criterion, the method including using a processor, obtaining from a user a criterion that relates to one or more of the executable actions; using a processor, analyzing each solution of the plurality of solutions, to determine based on a graph representation of the solution whether that solution satisfies the obtained criterion; and if a solution of the plurality of solutions was determined to satisfy the obtained criterion, using a processor, generating a test code from that solution and executing the test on a DUT.

According to some embodiments of the present invention, the determining whether that solution satisfies the criterion comprises applying one or a plurality of queries to determine whether that solution satisfies the obtained criterion.

According to some embodiments of the present invention, the determining based on the graph representation of the solution whether that solution satisfies the criterion comprises applying a plurality of queries.

According to some embodiments of the present invention, the query is selected from the group consisting of: query to determine whether a specific instance of an action in a solution is to be fully executed before another instance of an action, query to determine whether a specific instance of an action in a solution is to be executed after another instance of an action was fully executed; query to determine whether two instances of actions are to be performed concurrently, query to determine whether one action is to be performed only if another action is not, and query designed to determine whether an action is to be performed repeatedly.

According to some embodiments of the present invention, the method includes outputting the solution which was determined to satisfy the obtained criterion.

According to some embodiments of the present invention, there is provided a system for automatically finding a verification test of a plurality of verification tests that were executed in a verification process of a design under test (DUT), or a solution of a plurality solutions that include actions, that satisfies a criterion, the system comprising: memory and a processor, wherein the processor is configured to: obtain from a user a criterion that relates to one or more actions; and obtain a log with logged execution data that includes start and end times for each action of each of the tests of the plurality of verification tests during an execution run of that test; and for each test of the plurality of verification tests, determine from the logged data whether that test satisfies the obtained criterion, or analyze each solution of the plurality of solutions, to determine based on a graph representation of the solution whether that solution satisfies the obtained criterion.

BRIEF DESCRIPTION OF THE DRAWINGS

In order to better understand the present invention, and appreciate its practical applications, the following figures are provided and referenced hereafter. It should be noted that the figures are given as examples only and in no way limit the scope of the invention. Like components are denoted by like reference numerals.

FIG. 2 illustrates a method for automated search to find an executed test that satisfies a criterion relating to one or more actions in that test, according to some embodiments of the present invention.

FIG. 3 shows a solution in which two actions appear to be designed to be executed concurrently, but where different executions may involve different time relations between the two "parallel" actions, according to some embodiments of the present invention.

DETAILED DESCRIPTION OF EMBODIMENTS OF THE INVENTION

Figure 1:
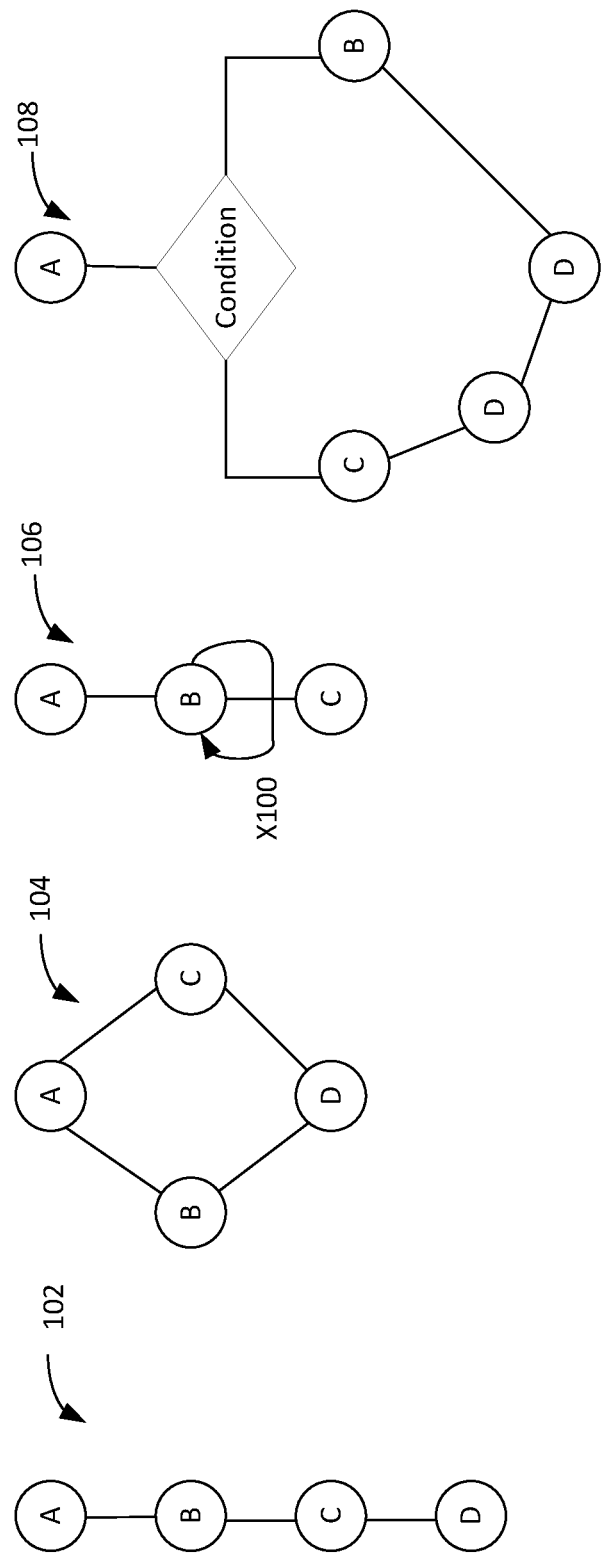
FIG. 1 illustrates four solutions presented in graphical form of directed graphs, according to some embodiments of the invention.

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

An electronic system (e.g., a smartphone) may typically be made up of a plurality of electronic devices (e.g., memory, camera, central processing unit—CPU, graphical processing unit-GPU, microphone, media player, etc.). At the early stages in the development of electronic design, a model of each of the electronic devices that form the electronic system can be built (typically in Verilog or other HDL language and verified, by simulating executions of a multitude of tests on the on a simulation of the device under test (DUT). In order to, for example, efficiently cover all (or substantially all) functionalities of the DUT a plurality of tests can be generated. The plurality of tests can be pieces of code, e.g., C-code, assembly, and/or other codes as are known in the art. Each of the plurality of tests can be generated from one of various scenarios which can be constructed by a one or a plurality of users. Each scenario can be made up of a plurality of actions which the user selects to be included in the scenario. The user may also define the order in which the selected actions are to be performed—consecutively or concurrently.

An electronic design automation (EDA) tool may allow a user to view a graph presentation of a scenario or to construct and rearrange the scenario by dragging actions (actually symbols of such actions) from a set of available actions into a designated space in a graphical user interface, defining the relations between the selected actions (the order in which they are to be performed—e.g., sequentially or in parallel), to define a scenario. Typically, the graph presentation is a directed graph, where actions of the scenario are vertices (nodes) and are connected by directed edges.

A scenario may include, for example, a set of actions put together by a validation expert (hereinafter—"user") that is to be tested on the DUT. A validated scenario (also referred to as "solution", or "generated solution") is a scenario that complies with system requirements and with test requirements, and may be converted into a test by generating a executable code form the solution, such as, for example, C-code or Assembly. That test may be fed to the DUT in the validation process to test its design.

Many tests are generated in verification processes, which are typically saved for possible future reuse.

Verification practitioners may wish to apply various operations on a generated solution, either before or after the actual test run, e.g., before the solution is created or generated, or after the test run has concluded. For example, assuming there are solutions/tests which may include actions A, B and C, a user may wish to: (1) collect coverage data over the flow of the test run (e.g., what is the number of B's located between A and C); (2) identify tests that contain at least one instance of A and B executed in parallel; (3) apply priority in the execution (by a test runner) to solutions that include at least a sequence of A followed by B followed by C; (4) identify solutions that satisfy a criterion or constraint (e.g., the time difference between action A and action B is not more than a predetermined time increment, etc.

FIG. 1 illustrates four solutions (may also be tests) presented in a graph form, according to some embodiments of the invention. All solutions are made up of actions A, B, C and D. Solution 102 has action A followed by action B, followed by action C and followed by action D. Solution 104 has action A followed by B and C, which upon completion are followed by D. Solution 106 has action A followed by action B which is repeated for 100 times before being followed by action C. Solution 108 has action A, which is followed by a condition. If the condition is true than action B follows, after which action D follows. If the condition is false, than then action C follows, after which action D follows twice, consecutively.

For example, when making of scenarios (before they are validated and tests generated from them), a user may specifically find interest in the order in which actions are arranged in a scenario, or provide more loose conditions (e.g., constraints) which are taken into account when the EDA tool computes the solutions.

It may be desired to search in a multitude of available tests, after these tests were executed, and find such tests that meet certain criterion or criteria (herein—"criteria"), relating to various characteristics or other features of the actions in these tests.

It may also be desired to search in a multitude of solutions, before actually using them (in a test code form) in validation tests, and find such solutions that meet certain criterion or criteria (herein—"criteria"), relating to various characteristics or other features of the actions in these solutions.

One way may be manually (or using a computer) sifting through all available solutions and finding the solutions that meet these criteria. Another way may be manually or using a computer designing one or more tests that meet these criteria. However, an automated method of finding validated scenarios (solutions) or generated tests which meet certain criteria may greatly improve and expedite the typically long and tedious verification process.

Some embodiments of the present invention are directed to automated method and system for finding solutions or previously run tests that meet a predetermined criterion or criteria. In some embodiments of the present invention the criterion or criteria relate to one or more actions of the tests or solutions. The relation may be for example, the order in which the actions are executed or planned to be executed, whether the actions are repeated, the relation in time between actions, e.g., are they performed, or planned to be performed concurrently, or one before the other (or vice versa), what is the time interval (difference) between the actions, e.g., the time between the end of the earlier action and the beginning of the later action, etc.

Some embodiments of the present invention are hereinafter described. Executed tests, which have logged data on their execution, e.g., in a log file, and validated solutions (hereinafter—"solutions" for brevity) are separately treated.

An automated method for finding a test or tests (post-run, that is, after execution of the tests) that meet certain criterion or criteria (hereinafter—"criterion" for brevity) involves referring to the tests in graph form, which makes it easier to understand the relations between actions, and referring to a log (e.g., a log file) which relates to each test and includes data logged during the execution of that test.

The log may include, for example, a chronologically ordered list of start and end times of actions of the test that were performed in the execution of that test. The actions may each be uniquely identified (for example by a unique number) in the log, and each action start and end time may be included in the log, as it was recorded during the execution of that test. Other information pertaining to the execution of that test may also be included in the log (e.g., messages planted by the user, identification of the thread in which an action was performed, identifying a core which executed a certain actions, etc).

In searching a test that satisfies a criterion related to actions in that test, the logged data is used to determine whether the test satisfies that criterion. Since the test was executed the logged data may provide logged information on the relations between actions in that test. So analyzing the logged data may be used in determining whether the test satisfies the criterion.

For example, the graph presentations of the solutions in FIG. 1 may be actually graph presentations of executed tests. A user may wish to search in the batch of tests depicted in FIG. 1 to find tests in which action C follows action B. when reviewing the graph presentations of the tests in FIG. 1 it may be easily discovered by a human eye that tests 102, and 106 meet that criterion while tests 104 and 108 do not. The graph presentation also makes it more amenable to automatic searching, e.g., by a processor, such as for example, described in this specification.

A log containing logged data of the execution of each the tests may be created when the test is executed. The verification tool running the test may create the log and include in that log data identifying the actions in the test and execution times: start time and end time. The logged data may also include other data, such as, messages, and other information on the execution.

According to some embodiments of the invention, the verification tool may be designed to receive a criterion (e.g., user defined or otherwise predetermined criterion) relating to one or more test actions and search in a set of executed tests and their corresponding logs of logged execution data to find a test or tests that meet that criterion.

The verification tool may be designed, upon receipt of the criterion, to search in the set of tests to find a test or tests that meet that criterion.

For example, the verification tool may be designed to define and apply one or a plurality of finite state machines (FSM) to determine the meeting of the criterion (e.g., identifying an action and a relation of that action with other action, or identifying actions and a relation between these actions that conform to the criterion. Using the FSMs the verification tool may screen the log of each test to determine whether that test conforms to (satisfies) the criterion. According to some embodiments of the invention a processor is used to automatically perform this method.

A criterion, according to some embodiments of the invention may relate to more than one action and/or more than one relation between actions in a test.

FIG. 2 illustrates a method for automated search to find an executed test that satisfies a criterion relating to one or more actions in that test, according to some embodiments of the present invention. A method for automatically searching and finding a verification test of a plurality of verification tests that were executed in a verification process of a design under test (DUT) that satisfies a criterion. Method 200 may include using a processor, obtaining 202 from a user a criterion that relates to one or more test actions. Method 200 may also include using a processor, obtaining 204 a log with logged execution data that includes start and end times for each action of each of the tests of the plurality of verification tests during an execution run of that test. Method 200 may also include, for each test of the plurality of verification tests, using a processor, determining 206 from the logged data whether that test satisfies the obtained criterion, and if a test of the plurality of verification tests was determined to satisfy the obtained criterion executing 208 that test on the DUT.

According to some embodiments of the present invention, the determining from the logged data whether that test satisfies the criterion may include applying a finite state machine on the logged data to determine whether that test satisfies the obtained criterion.

According to some embodiments of the invention, the determining from the logged data whether that test satisfies the criterion comprises applying a plurality of finite state machines on the logged data to determine whether that test satisfies the obtained criterion.

According to some embodiments the criterion may be selected from the group consisting of: the order in which test actions are executed or planned to be executed, whether the actions are repeated, a relation in time between test actions, test actions performed, or planned to be performed concurrently, test actions performed one before the other, the time interval between test actions, the time between the end of an earlier action and the beginning of a later action.

According to some embodiments of the invention, the log may contain items selected from the group consisting of chronologically ordered list of start and end times of test actions that were performed in the execution a test, unique identification of each of the actions messages, identification of a thread in which an action of the test actions was performed, and identification of a core which executed an action of the actions.

According to some embodiments of the present invention, if it was determined that the test satisfies the obtained criterion, the method may further include identifying one or more instances of said one or more test actions that conform to the criterion.

According to some embodiments of the present invention, the method may further include outputting the test which was determined to satisfy the obtained criterion and the identified instances of said one or more test actions.

According to some embodiments of the present invention the method may include executing the plurality of tests on a DUT and recording the logged data.

When dealing with solutions (pre-run, that is before the solution is transformed into a test code and executed), there is no available execution information. This may make the determination of whether a solution conforms to the obtained criterion a bit more complicated. Yet, pre-run approach is aimed at reducing the number of tests for execution by efficiently selecting solutions of particular interest and generating test code only for those solutions. Execution tests requires computing resources, and it may prudent to try and reduce the number of tests for execution in the verification process, yet aim at covering efficiently the issues that needs to be addressed by the verification tests.

While it is fairly easy to determine that a certain action, e.g., action C in solution 102 shown in FIG. 1, will be performed after action B was completed, due to the serial order of these actions in that solution, sometimes it may not be possible to determine which of two actions in a solution would be executed before the other, for example in the case of actions B and C in solution 104 shown in FIG. 1.

There may be some uncertainty as to the exact start and end times of each of the parallel actions. For example, action B may be designed to be executed in a certain thread that dictates that that action be performed on a certain core, while action C may be designed to be executed in a different thread, and by a different core. Despite the fact that in solution 104 actions B and C appear to be designed to be executed in parallel, in certain conditions (e.g., congested core) one action may be completed before the other action commences. This uncertainty is not altogether avoidable, but a method according to some embodiments of the invention may still offer a fairly good, working solution to that problem.

FIG. 3 shows a solution (104 of FIG. 1, marked in this figure as 104*a*) in which two actions appear to be designed to be executed concurrently, but where different executions may involve different time relations between the two "parallel" actions, according to some embodiments of the present invention. Straight line marked "Time" indicates the progress of time (in the direction of the arrow head). The dashed line is provided to indicate a parallel time instance.

In one particular execution instance, such as depicted in solution 104*a*, action B and action C may be executed in parallel, so that actions C and B commence and end substantially at the same time. In more realistic situations, the start and end times of actions B and C may not necessarily overlap. For example, action B may commence and end at a specific time (marked by the dashed line) before action C commences (e.g., such as in solution 104*b*), or action B may start before action C starts, and followed by the start time of action C, then action B ends while action C is still executed, at a time instance marked by the dashed line.

So placing actions in parallel arrangement in a solution does not necessarily implies that they indeed will be executed simultaneously (start and end times of the actions overlapping) or eve concurrently (some overlapping between the actions).

Embodiments of the present invention may include a pre-run method of searching and finding a solution that satisfies a criterion.

According to some embodiments of the present invention, a novel set of queries may be used on the graph presentation of solutions.

One such query is aimed at determining whether a specific instance of an action in a solution is to be fully executed before another instance of an action. The query may be written in the form of "is before (x. y)", where x and y are the instances in question. The query is designed to return "true" if x is before y, and "false" if x is not before y. This query is designed to return "true" if and only if the execution of x is to be completed before the execution of y starts. This means that x is located at a higher hierarchy level in the structure of the graph representing the solution.

Similarly, another query may be used, aimed at determining whether a specific instance of an action in a solution is to be executed after another instance of an action was fully executed. The query may be written in the form of "is after (x. y)", where x and y are the instances in question. The query is designed to return "true" if x is after y, and "false" if x is not after y. This query is designed to return "true" if and only if the execution of x is to be performed after the execution of y has ended. This means that x is located at a lower hierarchy level in the structure of the graph representing the solution.

Another query my may be used, designed to determine whether two instances of actions are to be performed concurrently, for example, in the form of "same time (x,y)" which returns "true" only if the instances x and y are to be performed concurrently. "same time (x,y)" is equivalent to "not before (x,y) and not before (y,x)".

It should be noted that since there are no real execution times associated with actions in a solution, only their position in the graph representation of the solution, it may be practically impossible to determine which action of several actions that appear to be designed to run concurrently, by their relative parallel position in the graph representation of the solution. It is only their relative position in the graph that is used in the analysis of the solution.

Another query may be used, aimed at determining whether one action is to be performed only if another action is not, which may be in the form of "alternative (x,y)", which will return "true" if according to the solution design action x is designed to be performed only if action y is not performed, such as, for example, in the case of a condition (e.g., condition in solution 108 shown in FIG. 1).

Yet another query may be used, designed to determine whether an action is to be performed repeatedly, which may be in the form of "repeatable (x)" and will return "true" if x is to be repeated in the solution in consideration, and "false" if x will not be repeated.

According to some embodiments of the present invention, using queries such as the above-mentioned queries, it may be possible to automatically analyze (using a processor) the structure of a solution, and determine whether a solution satisfies a criterion relating to actions in that solution.

For example, if a user wants to search and find a solution (of a set of solutions) in which actions A and B are to be executed concurrently, the user may use the query "same time (A.B)" in analyzing each of the solutions in the set of solutions to find a solution or solutions that comply with this criterion.

Figure 4:
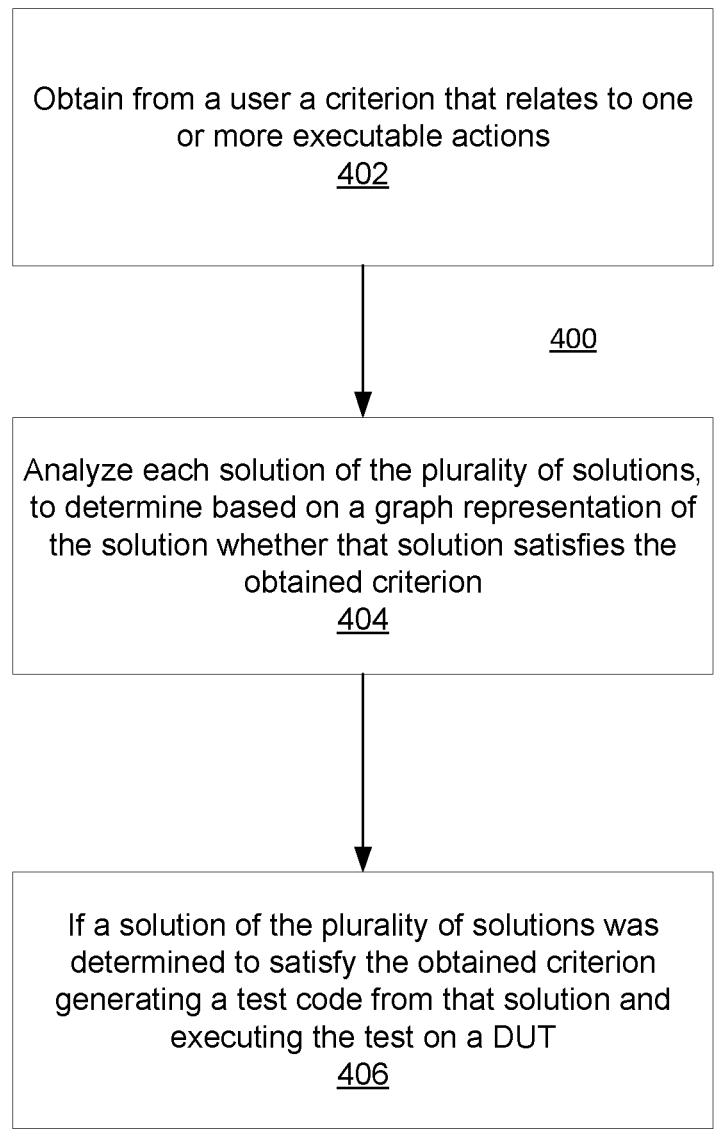
FIG. 4 shows a method for automatically finding a solution that includes actions of a plurality of solutions for use in verification that satisfies a criterion, according to some embodiments of the invention.

FIG. 4 shows a method 400 for automatically finding a solution of a plurality of solutions that includes executable actions of a plurality of solutions for use in verification that satisfies a criterion, according to some embodiments of the invention.

Method 400 includes using a processor, obtaining 402 from a user a criterion that relates to one or more of the executable actions. Method 400 may also include using a processor, analyzing 404 each solution of the plurality of solutions, to determine based on a graph representation of the solution whether that solution satisfies the obtained criterion. Method 400 may also include, if a solution of the plurality of solutions was determined to satisfy the obtained criterion, using a processor, generating 406 a test code from that solution and executing the test on a DUT.

According to some embodiments of the invention, the determining whether that solution satisfies the criterion comprises applying one or a plurality of queries to determine whether that solution satisfies the obtained criterion.

According to some embodiments of the invention, the determining based on the graph representation of the solution whether that solution satisfies the criterion comprises applying a plurality of queries.

According to some embodiments of the invention, the query is selected from the group consisting of: query to determine whether a specific instance of an action in a solution is to be fully executed before another instance of an action, query to determine whether a specific instance of an action in a solution is to be executed after another instance of an action was fully executed; query to determine whether two instances of actions are to be performed concurrently, query to determine whether one action is to be performed only if another action is not, and query designed to determine whether an action is to be performed repeatedly.

According to some embodiments of the invention, the method also includes outputting the solution which was determined to satisfy the obtained criterion.

Some or all of the method steps according to some embodiments of the invention may be performed using the constraint-solver that is typically used in generating verified solutions, acting as a checker.

Figure 5:
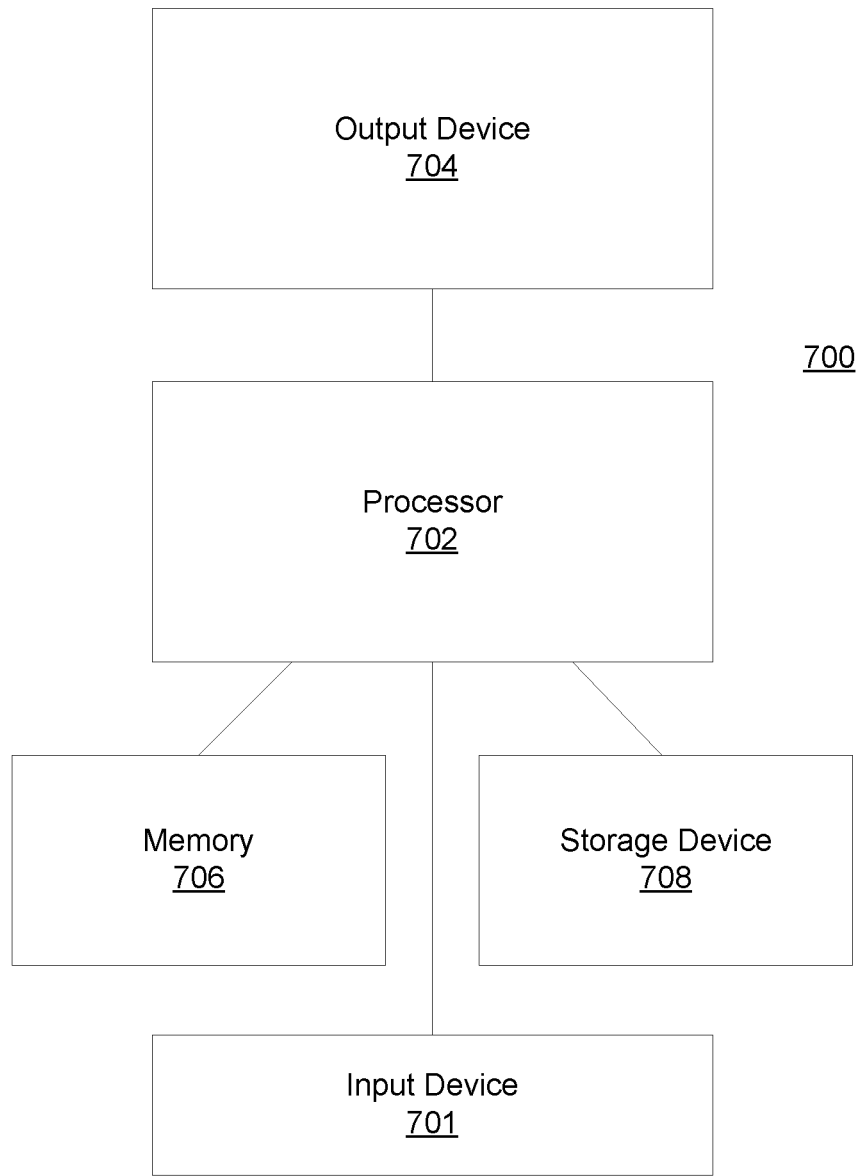

FIG. 5 illustrates a system 700 for automatically finding a verification test of a plurality of verification tests that were executed in a verification process of a design under test (DUT), or a solution of a plurality solutions that include actions, that satisfies a criterion, according to some embodiments of the present invention. System 700 may include a processor 702 (e.g. single processor or a processing unit made that includes a plurality of processors, on a single machine or distributed on a plurality of machines) for executing a method according to some embodiments of the present invention. Processing unit 702 may be configured to automatically find a verification test of a plurality of verification tests that were executed in a verification process of a design under test (DUT), or a solution of a plurality solutions that include actions, that satisfies a criterion.

In accordance with some embodiments of the present invention, the verification process may become more automated, freeing the user from having to manually sift through executed tests or solutions. Not only is such work a tedious job, but a human user is typically unable to effectively cover large batches of information and thus error may result that may further cause significant waste of resources (human time and computing resources), which may be saved by employing systems and methods according to some embodiments of the present invention. Furthermore, automatically including access management commands in the code may free the programmers from some planning considerations when allocating memory for the DUT, or at least reduce some of these considerations and therefore has the potential to shorten verification time and to render the verification process more efficient.

Processor 702 may be linked with memory 706 on which a program implementing a method according to some embodiments of the present invention and corresponding data may be loaded and run from, and storage device 708, which includes a non-transitory computer readable medium (or mediums) such as, for example, one or a plurality of hard disks, flash memory devices, etc. on which a program implementing a method according to some embodiments of the present invention and corresponding data may be stored. System 700 may further include an output device 704 (e.g. display device such as CRT, LCD, LED etc.) on which one or a plurality user interfaces associated with a program implementing a method according to some embodiments of the present invention and corresponding data may be presented. System 700 may also include input interface 701, such as, for example, one or a plurality of keyboards, pointing devices, touch sensitive surfaces (e.g. touch sensitive screens), etc. for allowing a user to input commands and data.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stored on the computer readable medium may be in the form of an installed application and in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

The invention claimed is:

1. A method for automatically finding a verification test of a plurality of verification tests that were executed in a verification process of a design under test (DUT) that satisfies a criterion, the method comprising:
   using a processor, obtaining from a user a criterion that relates to one or more test actions;
   using a processor, obtaining a log with logged execution data that includes start and end times for each action of each of the tests of the plurality of verification tests during an execution run of that test;
   for each test of the plurality of verification tests, using a processor, determining from the logged data whether that test satisfies the obtained criterion; and
   if a test of the plurality of verification tests was determined to satisfy the obtained criterion, using a processor, executing that test on the DUT.

2. The method of claim 1, wherein the determining from the logged data whether that test satisfies the criterion comprises applying a finite state machine on the logged data to determine whether that test satisfies the obtained conditions.

3. The method of claim 2, wherein the determining from the logged data whether that test satisfies the condition comprises applying a plurality of finite state machines on the logged data to determine whether that test satisfies the obtained criterion.

4. The method of claim 1, wherein the criterion is selected from the group consisting of:
   an order in which test actions are executed or planned to be executed, whether the actions are repeated, a relation in time between test actions, test actions performed, or planned to be performed concurrently, test actions performed one before the other, a time interval between test actions, a time between the end of an earlier action and the beginning of a later action.

5. The method of claim 1, wherein the log contains items selected from the group consisting of: chronologically ordered list of start and end times of test actions that were performed in the execution of a test, unique identification of each of actions messages, identification of a thread in which an action of the test actions was performed, and identification of a core which executed an action of the actions.

6. The method of claim 1, further comprising, if it was determined that the test satisfies the obtained criterion, identifying one or more instances of said one or more test actions that conform to the criterion.

7. The method of claim 6 further comprising outputting the test which was determined to satisfy the obtained criterion and the identified instances of said one or more test actions.

8. A method for automatically finding a solution that satisfies a criterion, the method comprising:
   using a processor, obtaining a plurality of solutions, each comprising executable actions, for use in verification process of a design under test (DUT);
   using a processor, obtaining from a user a criterion that relates to one or more of the executable actions;
   using a processor, analyzing each solution of the plurality of solutions, to determine based on a graph representation of the solution whether that solution satisfies the obtained criterion;
   using a processor, selecting, from the plurality of solutions, solutions that satisfy the obtained criterion; and
   using a processor, generating a test code from that the selected solutions and executing the test code on the DUT.

9. The method of claim 8, wherein the determining whether that solution satisfies the criterion comprises applying one or a plurality of queries to determine whether that solution satisfies the obtained criterion.

10. The method of claim 9, wherein the determining based on the graph representation of the solution whether that solution satisfies the criterion comprises applying a plurality of queries.

11. The method of claim 9, wherein the query is selected from the group consisting of:
    query to determine whether a specific instance of an action in a solution is to be fully executed before another instance of an action, query to determine whether a specific instance of an action in a solution is to be executed after another instance of an action was fully executed; query to determine whether two instances of actions are to be performed concurrently, query to determine whether one action is to be performed only if another action is not, and query designed to determine whether an action is to be performed repeatedly.

12. The method of claim 8 further comprising outputting the solution which was determined to satisfy the obtained criterion.

13. A system for automatically finding a verification test of a plurality of verification tests that were executed in a verification process of a design under test (DUT), that satisfies a criterion, the system comprising:
    memory and a processor,
    wherein the processor is configured to:
       obtain from a user a criterion that relates to one or more actions;
       obtain a log with logged execution data that includes start and end times for each action of each of the tests of the plurality of verification tests during an execution run of that test; and
       for each test of the plurality of verification tests, determine from the logged data whether that test satisfies the obtained criterion.

14. The system of claim 13, wherein in determining from the logged data whether that test satisfies the criterion the processor is configured to apply a finite state machine on the logged data to determine whether that test satisfies the obtained conditions.

15. The system of claim 14, wherein in determining from the logged data whether that test satisfies the condition the processor is configured to apply a plurality of finite state machines on the logged data to determine whether that test satisfies the obtained criterion.

16. The system of claim 13, wherein the criterion is selected from the group consisting of:
   the order in which test actions are executed or planned to be executed, whether the actions are repeated, a relation in time between test actions, test actions performed, or planned to be performed concurrently, test actions performed one before the other, the time interval between test actions, the time between the end of an earlier action and the beginning of a later action.

17. The system of claim 13, wherein the log contains items selected from the group consisting of chronologically ordered list of start and end times of test actions that were performed in the execution a test, unique identification of each of the actions messages, identification of a thread in which an action of the test actions was performed, and identification of a core which executed an action of the actions.

* * * * *